United States Patent
Zhang et al.

(10) Patent No.: US 12,453,190 B2
(45) Date of Patent: Oct. 21, 2025

(54) METHOD FOR PREPARING HETEROJUNCTION SOLAR CELL, HETEROJUNCTION SOLAR CELL AND APPLICATION THEREOF

(71) Applicant: TONGWEI SOLAR (CHENGDU) CO., LTD., Chengdu (CN)

(72) Inventors: Haichuan Zhang, Chengdu (CN); Shihu Lan, Chengdu (CN); Liping Zhang, Chengdu (CN); Hui Zhao, Chengdu (CN); Jianhua Shi, Chengdu (CN); Haoxin Fu, Chengdu (CN); Junlin Du, Chengdu (CN); Fanying Meng, Chengdu (CN); Zhengxin Liu, Chengdu (CN)

(73) Assignee: TONGWEI SOLAR (CHENGDU) CO., LTD., Chengdu (CN)

( * ) Notice: Subject to any disclaimer, the term of this patent is extended or adjusted under 35 U.S.C. 154(b) by 0 days.

(21) Appl. No.: 18/247,368

(22) PCT Filed: Aug. 30, 2022

(86) PCT No.: PCT/CN2022/115836
§ 371 (c)(1),
(2) Date: Mar. 30, 2023

(87) PCT Pub. No.: WO2023/103477
PCT Pub. Date: Jun. 15, 2023

(65) Prior Publication Data
US 2024/0274741 A1 Aug. 15, 2024

(30) Foreign Application Priority Data
Dec. 11, 2021 (CN) .......................... 202111513014.X

(51) Int. Cl.
*H10F 10/166* (2025.01)
*H10F 71/10* (2025.01)

(52) U.S. Cl.
CPC ........... *H10F 10/166* (2025.01); *H10F 71/10* (2025.01); *H10F 71/103* (2025.01)

(58) Field of Classification Search
CPC ....... H10F 10/166; H10F 71/103; H10F 71/10
See application file for complete search history.

(56) References Cited

U.S. PATENT DOCUMENTS

| 2011/0104849 A1 | 5/2011 | Terakawa |
| 2014/0102527 A1* | 4/2014 | Ogane ................... H10F 71/103 136/255 |
| 2014/0360577 A1 | 12/2014 | Tsunomura et al. |

FOREIGN PATENT DOCUMENTS

| CN | 109449227 | * | 3/2019 |
| CN | 109449227 A | | 3/2019 |

(Continued)

OTHER PUBLICATIONS

Extended European Search Report for corresponding Application No. 22871160.2, dated Sep. 4, 2024, 11 pages.

(Continued)

*Primary Examiner* — Jayne L Mershon
(74) *Attorney, Agent, or Firm* — Dority & Manning, PA

(57) ABSTRACT

A preparation method of a heterojunction solar cell includes following steps: depositing a first passivation layer on a first surface of a silicon substrate by using a gas source, a base material of the first passivation layer being hydrogenated amorphous silicon; during depositing hydrogenated amorphous silicon of the first passivation layer, allowing the gas source to gradually incorporate carbon dioxide, and controlling a proportion of carbon dioxide in the gas source to (Continued)

gradually increase with increase of a thickness of the first passivation layer which has been deposited.

10 Claims, 2 Drawing Sheets

(56) References Cited

FOREIGN PATENT DOCUMENTS

| | | |
|---|---|---|
| CN | 110416345 A | 11/2019 |
| CN | 113363356 A | 9/2021 |
| CN | 114220887 A | 3/2022 |
| JP | 2016072523 A | 5/2016 |

OTHER PUBLICATIONS

J. Ge et al., "Excellent Silicon Surface Passivation Achieved by Industrial Inductively Coupled Plasma Deposited Hydrogenated Intrinsic Amorphous Silicon Suboxide", Research Article, Hindawi Publishing Corporation, International Journal of Photoenergy, vol. 2014, 12 pages.

G. Das et al., "Effect of oxide based graded buffer and bottom n-layer on the performance of the single junction amorphous silicon solar cells", J. Mater Sci: Mater Electron, 2017, 28, pp. 16165-16172.

PCT International Search Report and Written Opinion for corresponding PCT Application No. PCT/CN2022/115836, mailed Nov. 21, 2022, 9 pages.

\* cited by examiner

METHOD FOR PREPARING HETEROJUNCTION SOLAR CELL, HETEROJUNCTION SOLAR CELL AND APPLICATION THEREOF

CROSS-REFERENCE TO RELATED APPLICATION

This application is a national phase application of international patent application No. PCT/CN2022/115836, filed Aug. 30, 2022, which, in turn, claims priority to Chinese patent application No. 202111513014X, filed on Dec. 11, 2021, and titled "METHOD FOR PREPARING HETEROJUNCTION SOLAR CELL, HETEROJUNCTION SOLAR CELL AND APPLICATION THEREOF", the contents of both of which are hereby incorporated herein in their entirety by reference.

TECHNICAL FIELD

The present application relates to the technical field of solar cells, and particularly to a method for preparing a heterojunction solar cell and the heterojunction solar cell.

BACKGROUND

A silicon heterojunction solar cell usually includes a doped amorphous silicon layer and an N-type monocrystalline silicon layer that constitute a heterojunction, and an intrinsic amorphous silicon layer interposed therebetween, which can achieve a good passivation effect at the heterojunction interfaces and a relatively high open circuit voltage of the solar cell. The silicon heterojunction solar cell has the advantages such as high conversion efficiency and high stability, and is a kind of solar cell that has attracted much attention in recent years.

However, the cost of the silicon heterojunction solar cell is still much higher than that of the passivated emitter and rear contact (PERC) solar cell, so it is necessary to consider how to reduce the cost of the silicon heterojunction solar cell and increase its gain in practical applications. The gain of the solar cell directly relates to the electricity generation amount. The parameter to measure the electricity generation amount of the solar cell is the output power of a solar cell module. Therefore, increasing the output power of a heterojunction solar cell module is an effective way to increase the gain. Generally speaking, the higher the conversion efficiency of the cell, the greater the output power of the solar cell module. For the same grade cells having the same or similar single cell conversion efficiency, the output power can be increased by increasing the cell to module (CTM) of the solar cell module. Herein the term "cell" refers to individual cells, the "module" refers to an assembly of cells, and "CTM" can be understood as the power change from the cells to a packaged module, and specifically is the ratio of the output power of the module to the total power of the cells. The higher the CTM value, the higher the output power of the heterojunction solar cell module. The CTM value of the traditional heterojunction solar cell needs to be further improved.

SUMMARY

According to some embodiments of the present disclosure, a method for preparing a heterojunction solar cell is provided, including following steps:

depositing a first passivation layer on a first surface of a silicon substrate by using a gas source, a base material of the first passivation layer being hydrogenated amorphous silicon; during depositing hydrogenated amorphous silicon of the first passivation layer, allowing the gas source to gradually incorporate carbon dioxide, and controlling a proportion of carbon dioxide in the gas source to gradually increase with increase of a thickness of the first passivation layer which has been deposited.

In some embodiments of the present disclosure, during the depositing of the first passivation layer, the proportion of carbon dioxide in the gas source gradually increases from 0.

In some embodiments of the present disclosure, during the depositing of the first passivation layer, a thickness of a deposited portion of the first passivation layer is controlled to be smaller than 2 nm when the proportion of carbon dioxide in the gas source is 0.

In some embodiments of the present disclosure, during the depositing of the first passivation layer, a maximum proportion of carbon dioxide in the gas source is 60%.

In some embodiments of the present disclosure, during the depositing of the first passivation layer, the proportion of carbon dioxide in the gas source increases step by step.

In some embodiments of the present disclosure, the proportion of carbon dioxide increases by 30% or less in adjacent steps.

In some embodiments of the present disclosure, the thickness of the first passivation layer deposited is controlled to be 7 nm to 12 nm.

In some embodiments of the present disclosure, the depositing of the first passivation layer includes following steps:

depositing a first passivation sublayer with a thickness of 1 nm to 2 nm on the silicon substrate by using the gas source in which the proportion of carbon dioxide is 0%;

depositing a second passivation sublayer with a thickness of 2 nm to 4 nm on the first passivation sublayer by using the gas source in which the proportion of carbon dioxide is 10% to 20%;

depositing a third passivation sublayer with a thickness of 3 nm to 6 nm on the second passivation sublayer by using the gas source in which the proportion of carbon dioxide is 30% to 40%.

In some embodiments of the present disclosure, the depositing of the first passivation layer specifically further includes: depositing a fourth passivation sublayer with a thickness of 1 nm to 3 nm on the third passivation sublayer by using the gas source in which the proportion of carbon dioxide is 50% to 60%.

In some embodiments of the present disclosure, during the depositing of the first passivation layer, a temperature of the silicon substrate is controlled to be 150° C. to 250° ° C.

In some embodiments of the present disclosure, a gas pressure in a deposition chamber is controlled to be 10 Pa to 100 Pa.

In some embodiments of the present disclosure, the method further includes following steps:

depositing a back surface field layer on the first passivation layer, wherein both the silicon substrate and the back surface field layer are in a first doping type;

depositing a second passivation layer on a second surface of the silicon substrate opposite to the first surface, the second passivation layer is made of hydrogenated amorphous silicon; and depositing an emission electrode layer on the second passivation layer, wherein the emission electrode layer is in a second doping type which is different from the first doping type.

The present disclosure also provides a heterojunction solar cell prepared by the method for preparing the solar cell in any one of the above embodiments.

According to some embodiments of the present disclosure, an application of the heterojunction solar cell in any one of the above embodiments, in a power generation device is also provided.

According to some embodiments of the present disclosure, a heterojunction solar cell is also provided, including:
a silicon substrate:
a first passivation layer, wherein the first passivation layer is stacked on a first surface of the silicon substrate, a base material of the first passivation layer is hydrogenated amorphous silicon, the first passivation layer is doped with oxygen atoms, and a proportion of the oxygen atoms in hydrogenated amorphous silicon of the first passivation layer gradually increases along a direction away from the silicon substrate.

In some embodiments of the present disclosure, in hydrogenated amorphous silicon of the first passivation layer, the proportion of the oxygen atoms increases step by step along the direction away from the silicon substrate.

In some embodiments of the present disclosure, a thickness of the first passivation layer is 7 nm to 12 nm.

In some embodiments of the present disclosure, the heterojunction solar cell further includes:
a back surface field layer, the back surface field layer being stacked on the first passivation layer, the silicon substrate and the back surface field layer being in a first doping type;
a second passivation layer, the second passivation layer being stacked on a second surface of the silicon substrate opposite to the first surface, and the second passivation layer is made of hydrogenated amorphous silicon;
an emission electrode layer, the emission electrode layer being stacked on the second passivation layer, and the emission electrode layer being in a second doping type.

According to some embodiments of the present disclosure, an application of the heterojunction solar cell in any one of the above embodiments, in a power generation device is also provided.

The details of one or more embodiments of the present disclosure will be described in the accompanying drawings and the description below. Other features, objects and advantages of the present disclosure will be apparent from the description, drawings and claims.

BRIEF DESCRIPTION OF THE DRAWINGS

In order to better describe and illustrate the embodiments and/or examples of the present application, reference can be made to one or more accompanying drawings. The additional details or examples used to describe the drawings shall not be construed as limitations to the scope of any of the disclosed application, the presently described embodiments and/or examples, and the presently understood best modes of the application.

Figure 1:
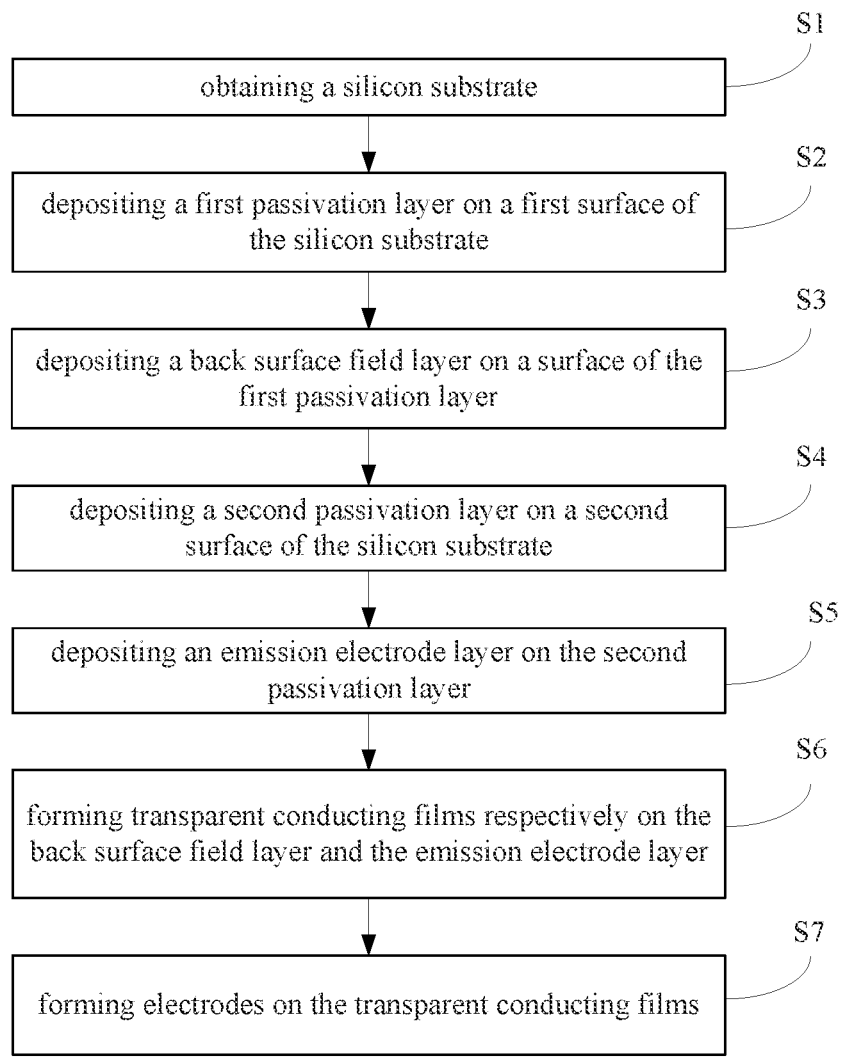
FIG. 1 is a schematic view of a preparation process of a heterojunction solar cell.

The reference signs and their specific meanings are as follows.

100, silicon substrate; 111, first passivation layer; 1111, first passivation sublayer; 1112, second passivation sublayer; 1113, third passivation sublayer; 1114, fourth passivation sublayer; 112, back surface field layer; 113, first transparent conducting layer; 114, first electrode layer; 121, second passivation layer; 122, emission electrode layer; 123, second transparent conducting layer; 124, second electrode layer.

DETAILED DESCRIPTION

The present application will now be described in detail with reference to the accompanying drawing in order to facilitate understanding of the present application. However, the present application can be implemented in many different forms and is not limited to the embodiments described herein. It should be understood that these embodiments are provided to facilitate a more thorough understanding of the disclosure of the present application.

Furthermore, the terms "first" and "second" are used for illustrative purposes only and shall not to be construed as indicating or implying relative importance or implicitly indicating the number or order of the indicated technical features. Therefore, a technical feature limited by "first" or "second" can explicitly or implicitly include at least one of the feature. In the description herein, "a plurality of" means at least two, e.g., two, three, etc., unless expressly and specifically defined otherwise.

In describing positional relationships, unless otherwise specified, when an element, such as a layer, a film, or a substrate, is referred to as being "above" another film or layer, it can be directly above the other layer, or there may be an intermediate layer. Furthermore, when a layer is referred to as being "under" another layer, it may be directly under the other layer, or there may be one or more intermediate layers. It will also be appreciated that when a layer is referred to as being "between" two layers, it may be the only layer between the two layers, or there may be one or more intermediate layers.

Unless indicated to the contrary, the singular terms may include the plural forms as well and shall not to be understood as referring to a quantity of one.

Unless defined otherwise, all technical and scientific terms used herein have the same meanings as commonly understood by those ordinary skilled in the art to which the present application belongs. The terms used in the description of the present application are for the purpose of illustrating specific embodiments only and are not intended to limit the present application.

According to an embodiment of the present disclosure, a method for preparing a heterojunction solar cell includes following steps:
depositing a first passivation layer on a first surface of a silicon substrate by using a gas source, wherein the silicon substrate is in a first doping type, and a base material of the first passivation layer is hydrogenated amorphous silicon;
during the depositing of the first passivation layer, allowing the gas source to gradually incorporate carbon dioxide, and controlling a proportion of carbon dioxide in the gas source to gradually increase with increase of a thickness of the first passivation layer that has been deposited.

depositing a back surface field layer on the first passivation layer, wherein the back surface field layer is in the first doping type:

depositing a second passivation layer on a second surface of the silicon substrate opposite to the first surface, wherein the second passivation layer is made of hydrogenated amorphous silicon; and depositing an emission electrode layer on the second passivation layer, wherein the emission electrode layer is in a second doping type which is different from the first doping type.

It can be understood that semiconductors include intrinsic semiconductors and doped semiconductors. The doped semiconductors refer to doping on the intrinsic semiconductors. The doping type of the doped semiconductors is n-type doping or p-type doping. The first doping type and the second doping type are different doping types.

The base material of the first passivation layer is hydrogenated amorphous silicon, which means that the first passivation layer can be made of hydrogenated amorphous silicon including other impurity atoms.

In the solar cell, the side with the back surface field layer is usually the light incident side, and the light can irradiate the silicon substrate through the back surface field layer and the first passivation layer, exciting the silicon substrate to generate photo-generated carriers. The silicon substrate and the emission electrode layer form a heterojunction, and the photo-generated carriers are separated through the heterojunction to produce a voltage.

It can be understood that the CTM value refers to the ratio of the output power of the module to the total power of the cells. For example, if the power of a single cell is 1, then the total power of 100 cells is 100, but the output power of the module formed by packaging the 100 cells into the module may be only 99, and thus the CTM value is 99%. In the conventional art, a single hydrogenated amorphous silicon film is usually used as the passivation layer between the substrate and the back surface field layer, and the CTM value of the heterojunction solar cell device prepared in this way is relatively limited. In order to increase the CTM value of the heterojunction solar cell device and thus increase the output power, the inventors have found through research that the CTM value of the solar cell device can be further improved through structural design.

Specifically, in the above-described method for preparing the heterojunction solar cell, the proportion of doping atoms in the formed portion of the first passivation layer is gradually increased by controlling the proportion of carbon dioxide to gradually increase with the increase of the deposition thickness of the first passivation layer. That is, in the first passivation layer, the doping atoms are distributed in gradient concentration. Experimental data show that, when the conversion efficiency is at the same level, as compared with the heterojunction solar cells without the doping atoms distributed in gradient concentration, the heterojunction solar cell devices prepared by the above-described method have higher CTM values, which is beneficial to increasing the output power of the heterojunction solar cell devices.

Specifically, the above-described method for preparing the heterojunction solar cell can refer to the preparation process shown in FIG. 1, which includes following steps.

Step S1, obtain the silicon substrate.

In a specific embodiment, the silicon substrate is made of monocrystalline silicon, and optionally, the monocrystalline silicon is N-type monocrystalline silicon. The silicon substrate has a first surface and a second surface opposite to each other, and the first surface is used as a light incident surface.

In a specific embodiment, the step of obtaining the silicon substrate further includes cleaning and texturizing the surfaces of the monocrystalline silicon. Specifically, the surfaces of the silicon substrate can be anisotropically etched with an etchant such as lye, so as to remove the mechanical damage layers on the surfaces of the silicon substrate and form clean light-trapping structures on the surfaces of the silicon substrate.

Step S2, deposit the first passivation layer on the first surface of the silicon substrate.

The base material of the first passivation layer is a hydrogenated amorphous silicon film. Optionally, the hydrogenated amorphous silicon film is specifically made of intrinsic hydrogenated amorphous silicon (a-Si:H<i>). The hydrogenated amorphous silicon film can be deposited by chemical vapor deposition. Optionally, the chemical vapor deposition method can specifically be, for example, plasma enhanced chemical vapor deposition (PECVD) or catalytic chemical vapor deposition (Cat.CVD). When preparing the hydrogenated amorphous silicon film by chemical vapor deposition, a gas source containing silicon and hydrogen elements usually needs to be used. For example, silane ($SiH_4$) or a mixture of silane and hydrogen gas can be used to prepare hydrogenated amorphous silicon. Further, it can be understood that in the preparation of the hydrogenated amorphous silicon film, considering the quality and interface state of the prepared film, the composition of the gas source may vary with the thickness of the film that has been deposited. For example, silane can be initially used and hydrogen gas can be gradually added during the deposition.

Further, in the present embodiment, in the process of depositing the first passivation layer, besides the gases used to form the hydrogenated amorphous silicon, the gas source also includes carbon dioxide whose proportion gradually increases with the increase of the thickness of the first passivation layer that has been deposited. The proportion of carbon dioxide in the gas source can be 0 at a certain time point or a certain period of time during the deposition process; that is, at this time point or this period of time, the gas source contains no carbon dioxide, and then with gradual increase of the thickness of the first passivation layer that is deposited, the proportion of carbon dioxide in the gas source is gradually increased. The proportion of carbon dioxide refers to the volume proportion of carbon dioxide.

By doping carbon dioxide into the gas source, the deposited hydrogenated amorphous silicon can include oxygen atoms. The doping of oxygen atoms can increase the band gap of hydrogenated amorphous silicon and reduce absorption of lights in a band from 300 nm to 700 nm by hydrogenated amorphous silicon, allowing more lights to pass through the first passivation layer, thereby increasing the short-circuit current of the heterojunction solar cell. However, due to the introduction of impurity oxygen atoms in the first passivation layer, the electrical conductivity of the first passivation layer may decrease, which reduces the fill factor of the heterojunction solar cell. For a passivation layer with a single concentration of oxygen atoms, the overall effect is to slightly increase the conversion efficiency of the heterojunction solar cell, and it is difficult to play a role in improving the CTM value.

In a specific embodiment, during the depositing of the first passivation layer, the proportion of carbon dioxide increases gradually from 0. That is, at the initial stage of deposition, the proportion of carbon dioxide is 0. As the thickness of the first passivation layer increases, carbon dioxide is gradually added to the gas source and the proportion of carbon dioxide is gradually increased.

In a specific embodiment, during the depositing of the first passivation layer, a maximum proportion of carbon dioxide is 60%. It can be understood that as the proportion of carbon dioxide increases, the concentration of oxygen atoms in the first passivation layer will also increase significantly, which will eventually lead to a significant decrease in the electrical conductivity of the first passivation layer, resulting in a significant decrease in the fill factor, which deteriorates the output power of the solar cell.

The proportion of carbon dioxide in the gas source may gradually increase in a continuous or intermittently manner. The continuous increase specifically refers to gradual increase of the proportion of carbon dioxide with time. The intermittent increase means that the deposition process is divided into multiple stages, the proportion of carbon dioxide in a latter stage is higher than that in a former stage, and the increase in the proportion of carbon dioxide from one to the other one of two adjacent stages is discontinuous. In a specific example of the present embodiment, during the depositing of the first passivation layer, the proportion of carbon dioxide in the gas source increases step by step. The step-by-step increase means that the depositing is divided into multiple stages, and the proportion of carbon dioxide in each stage is fixed, and the proportion of carbon dioxide in the latter stage is higher than that in the former stage.

Further, during the depositing of the first passivation layer, the proportion of carbon dioxide in the gas source increases by ≤30% each time, so as to avoid significant distortion between adjacent deposition sections of the first passivation layer. Optionally, the proportion of carbon dioxide in the gas source increases by ≤20% each time. For example, the proportion of carbon dioxide in the first stage is 0, the proportion of carbon dioxide in the second stage can be, for example, 5%, 10%, 15%, 20%, etc., and not exceeding 20%. Optionally, during the depositing of the first passivation layer, the proportion of carbon dioxide in the gas source increases by >5% each time.

In a specific embodiment, the deposited first passivation layer has a thickness of 7 nm to 12 nm.

In a specific embodiment, optionally, the depositing of the first passivation layer specifically includes following steps: depositing a first passivation sublayer with a thickness of 1 nm to 2 nm on the silicon substrate by using the gas source in which the proportion of carbon dioxide is 0%; depositing a second passivation sublayer with a thickness of 2 nm to 4 nm on the first passivation sublayer by using the gas source in which the proportion of carbon dioxide is 10% to 20%; depositing a third passivation sublayer with a thickness of 3 nm to 6 nm on the second passivation sublayer by using the gas source in which the proportion of carbon dioxide is 30% to 40%. Further, the depositing of the first passivation layer specifically further includes: depositing a fourth passivation sublayer with a thickness of 1 nm to 3 nm on the third passivation sublayer by using the gas source in which the proportion of carbon dioxide is 50% to 60%. It can be understood that during depositing of a passivation sublayer, the proportion of carbon dioxide may be not fixed, as long as the final total thickness is within the above range. For example, during the depositing of the second passivation sublayer, a gas source with carbon dioxide accounting for 10% can be used to deposit a material with a thickness of 1 nm, and then a gas source with carbon dioxide accounting for 20% can be used to deposit a material with a thickness of 1 nm. The combination of the above-mentioned proportions for the passivation sublayers not only effectively improves the CTM value of the heterojunction solar cell device, but also maintains the overall film quality of the first passivation layer, balancing the short-circuit current with the fill factor as much as possible and optimizing the output power of the solar cell.

In a specific embodiment, during the depositing of the first passivation layer, the temperature of the silicon substrate is controlled to be 150° C. to 250° C.

In a specific embodiment, the gas pressure in the deposition chamber is controlled to be 10 Pa to 100 Pa.

Step S3, deposit the back surface field layer on a surface of the first passivation layer.

In a specific embodiment, the specific method for preparing the back surface field layer is chemical vapor deposition. Further, the specific method for preparing the back surface field layer can be PECVD or Cat.CVD. The back surface field layer is a film with a first doping type. For example, corresponding to the N-type monocrystalline silicon substrate, the doping type of the back surface field layer is also N-type.

In a specific embodiment, the thickness of the back surface field layer is 5 nm to 30 nm, and further, the thickness of the back surface field layer is 5 nm to 15 nm. Optionally, the thickness of the back surface field layer is 5 nm, 7 nm, 9 nm, 11 nm, 13 nm, or 15 nm.

In a specific embodiment, the back surface field layer is selected from a hydrogenated amorphous silicon film, a hydrogenated microcrystalline silicon film, a hydrogenated amorphous silicon oxide film, or a hydrogenated microcrystalline silicon oxide film. Specifically, the back surface field layer is selected from an N-type hydrogenated amorphous silicon film (a-Si:H<n>), an N-type hydrogenated microcrystalline silicon film (uc-Si:H<n>), an N-type hydrogenated amorphous silicon oxide film (a-SiO$_x$:H<n>), or an N-type hydrogenated microcrystalline silicon oxide film (uc-SiO$_x$:H<n>).

In a specific embodiment, when depositing the N-type back surface field layer, the back surface field layer deposition gas includes phosphine ($PH_3$) with a concentration of 0.5% to 5%, and as phosphine includes phosphorus atoms, the resulting silicon is N-type doped.

In a specific embodiment, during the depositing of the back surface field layer, the temperature of the silicon substrate is controlled to be 150° C. to 250° C.

In a specific embodiment, during the depositing of the back surface field layer, the gas pressure in the deposition chamber is controlled to be 10 Pa to 100 Pa.

Step S4, deposit the second passivation layer on the second surface of the silicon substrate.

The second passivation layer is a hydrogenated microcrystalline silicon film or a hydrogenated amorphous silicon film. The second passivation layer can be formed by a conventional method for forming hydrogenated amorphous silicon or hydrogenated microcrystalline silicon. For example, $SiH_4$ or a mixture of $SiH_4$ and hydrogen gas is used as the gas source to deposit hydrogenated amorphous silicon on the second surface of the silicon substrate.

In a specific embodiment, the thickness of the second passivation layer is 4 nm to 10 nm. Optionally, the thickness of the second passivation layer is 4 nm, 5 nm, 7 nm, 9 nm, or 10 nm.

In a specific embodiment, the specific method for preparing the second passivation layer is chemical vapor deposition. Further, the specific method for preparing the second passivation layer can be PECVD or Cat.CVD.

In a specific embodiment, during the depositing of the second passivation layer, the temperature of the silicon substrate is controlled to be 150° ° C. to 250° C.

In a specific embodiment, during the depositing of the second passivation layer, the gas pressure in the deposition chamber is controlled to be 10 Pa to 100 Pa.

Step S5, deposit the emission electrode layer on the second passivation layer.

The emission electrode layer is a thin film with the second doping type. For example, corresponding to an N-type monocrystalline silicon substrate, the doping type of the emission electrode layer is P-type. It can be understood that the location on the second passivation layer refers to the surface of the second passivation layer away from the silicon substrate, rather than a specific orientation.

In a specific embodiment, the thickness of the emission electrode layer is 8 nm to 20 nm. Optionally, the thickness of the emission electrode layer is 8 nm, 10 nm, 12 nm, 15 nm, 18 nm, or 20 nm.

In a specific embodiment, the emission electrode layer is a hydrogenated amorphous silicon film or a hydrogenated microcrystalline silicon film. Specifically, the emission electrode layer is a P-type hydrogenated amorphous silicon film (a-Si:H<p>) or a P-type hydrogenated microcrystalline silicon film (uc-Si:H<p>).

In a specific embodiment, when depositing the P-type emission electrode layer, the emission electrode layer deposition gas includes a borohydride compound, such as diborane ($B_2H_6$), with a concentration of 0.5% to 5%. As diborane includes boron atoms, the resulting silicon is P-type doped.

In a specific embodiment, during the depositing of the emission electrode layer, the temperature of the silicon substrate is controlled to be 150° ° C. to 250° C.

In a specific embodiment, during the depositing of the emission electrode layer, the gas pressure in the deposition chamber is controlled to be 10 Pa to 100 Pa.

In step S6, form transparent conducting films respectively on the back surface field layer and the emission electrode layer.

The transparent conducting films are transparent conductive oxide (TCO) films. The method for forming the TCO films can be physical vapor deposition, such as radio frequency sputtering, direct current sputtering, or pulse sputtering. It can be understood that the TCO films on the back surface field layer and the emission electrode layer can be simultaneously or separately formed.

Specifically, the transparent conducting films include a first transparent conducting layer and a second transparent conducting layer respectively. The first transparent conducting layer is formed on the back surface field layer, and the second transparent conducting layer is formed on the emission electrode layer. The location on the back surface field layer refers to the surface of the back surface field layer on the side away from the silicon substrate, and the location on the emission electrode layer refers to the surface of the emission electrode layer on the side away from the silicon substrate.

In a specific embodiment, the thickness of the first transparent conducting layer and/or the second transparent conducting layer is 50 nm to 200 nm.

Step S7, form electrodes on the transparent conducting films.

The electrodes include a first electrode layer and a second electrode layer. Specifically, the first electrode layer is formed on the first transparent conducting layer, and the second electrode layer is formed on the second transparent conducting layer. The electrodes on both sides can be formed simultaneously or separately.

In a specific embodiment, in order to increase the transmittance of light, the first electrode layer is a grid line electrode.

In a specific embodiment, the electrodes are silver electrodes. Further, the method for forming the electrodes on the transparent conducting films can be screen printing, evaporation, magnetron sputtering, or inkjet printing.

In a specific embodiment, the thickness of the first electrode layer and/or the second electrode layer is 2 μm to 50 μm.

Through the above steps S1 to S7, the overall preparation of the heterojunction solar cell can be completed.

Figure 2:
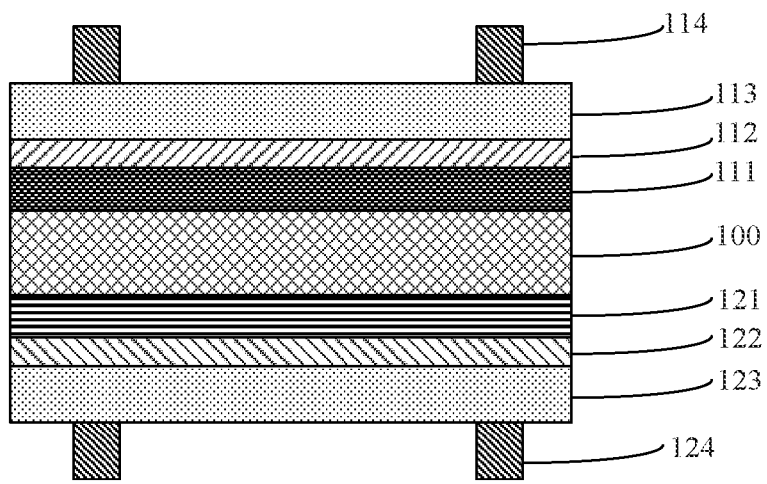
FIG. 2 is a schematic structural view of a heterojunction solar cell.

Further, referring to FIG. 2, another embodiment of the present disclosure provides a heterojunction solar cell, which includes a silicon substrate 100, a first passivation layer 111, a back surface field layer 112, a second passivation layer 121, and an emission electrode layer 122.

The silicon substrate 100 is in the first doping type. The first passivation layer 111 is stacked on the first surface of the silicon substrate 100. The first passivation layer 111 is a hydrogenated amorphous silicon film doped with oxygen atoms. The proportion of the oxygen atoms in the first passivation layer 111 gradually increases along a direction away from the silicon substrate 100. The back surface field layer 112 is stacked on the first passivation layer 111, and the back surface field layer 112 is a thin film with the first doping type. The second passivation layer 121 is stacked on the second surface of the silicon substrate 100 opposite to the first surface, and the second passivation layer 121 is a hydrogenated microcrystalline silicon film or a hydrogenated amorphous silicon film. The emission electrode layer 122 is stacked on the second passivation layer 121, and the emission electrode layer 122 is a thin film with the second doping type.

In a specific embodiment, the concentration of oxygen atoms in the first passivation layer 111 increases step by step along the direction away from the silicon substrate 100.

Figure 3:
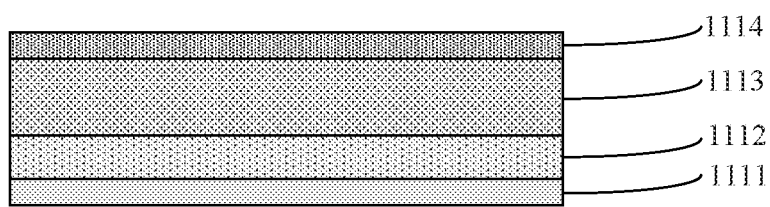
FIG. 3 is a schematic structural view of a first passivation layer in FIG. 2.

In a specific embodiment, the first passivation layer Ill is formed in step S2 of the preparation method in the above embodiment. Specifically, as shown in FIG. 3, the first passivation layer 111 includes a first passivation sublayer 1111, a second passivation sublayer 1112, and a third passivation sublayer 1113. The first passivation sublayer 1111 is formed by depositing with a gas source containing 0% of carbon dioxide, and the thickness is 1 nm to 2 nm. The second passivation sublayer 1112 is formed by depositing with a gas source containing 10% to 20% of carbon dioxide, and the thickness is 2 nm to 4 nm. The third passivation sublayer 1113 is formed by depositing with a gas source containing 30% to 40% of carbon dioxide, and the thickness is 3 nm to 6 nm.

Further, as shown in FIG. 3, the first passivation layer 111 further includes a fourth passivation sublayer 1114. The fourth passivation sublayer 1114 is formed with a gas source containing 50% to 60% of carbon dioxide, and the thickness is 1 nm to 3 nm.

In a specific embodiment, the thickness of the first passivation layer 111 is 7 nm to 12 nm.

In a specific embodiment, the thickness of the back surface field layer 112 is 5 nm to 30 nm. Further, the thickness of the back surface field layer 112 is 5 nm to 15 nm. Optionally, the thickness of the back surface field layer 112 is 5 nm, 7 nm, 9 nm, 11 nm, 13 nm, or 15 nm.

In a specific embodiment, the thickness of the second passivation layer 121 is 4 nm to 10 nm. Optionally, the thickness of the second passivation layer 121 is 4 nm, 5 nm, 7 nm, 9 nm, or 10 nm.

In a specific embodiment, the thickness of the emission electrode layer 122 is 8 nm to 20 nm. Optionally, the thickness of the emission electrode layer 122 is 8 nm, 10 nm, 12 nm, 15 nm, 18 nm or 20 nm.

Referring to FIG. 2, the heterojunction solar cell further includes a first transparent conducting layer 113 and a second transparent conducting layer 123. The first transparent conducting layer 113 is disposed on the back surface field layer 112, and the second transparent conducting layer 123 is disposed on the emission electrode layer 122. In a specific example, the thickness of the first transparent conducting layer 113 and/or the second transparent conducting layer 123 is 50 nm to 200 nm.

Referring to FIG. 2, the heterojunction solar cell further includes a first electrode layer 114 and a second electrode layer 124. The first electrode layer 114 is disposed on the first transparent conducting layer 113, and the second electrode layer 124 is disposed on the second transparent conducting layer 123. In a specific example, the thickness of the first electrode layer 114 and/or the second electrode layer 124 is 2 μm to 50 μm.

Further, another embodiment of the present disclosure also provides an application of the heterojunction solar cell in a power generation device. Specifically, the heterojunction solar cell is the heterojunction solar cell prepared by the method for preparing the heterojunction solar cell in any of the above embodiments, or is the heterojunction solar cell in any of the above embodiments.

In order to make the present disclosure be more readily understood and realized, the following specific and detailed examples and comparative examples that are easy to be implemented are provided for reference. The embodiments of the present disclosure and their advantages will also be apparent from the following description of the specific examples, the comparative examples, and the performances thereof.

Unless otherwise specified, the raw materials used in the following examples can be routinely purchased from the market.

In addition, in the actual preparation process, the actual thickness of each layer may be slightly different from the test result, but it does not affect the implementation of the examples and comparative examples.

Example 1

An n-type monocrystalline silicon wafer was adopted as the silicon substrate. The n-type monocrystalline silicon wafer was cleaned and textured with lye to form pyramid-shaped light-trapping structures.

The first passivation layer was deposited on the first surface of the silicon substrate by PECVD. The specific process was as follows: (1) an a-Si:H<i> layer with a thickness of 2 nm as the first passivation sublayer was deposited by using $SiH_4$ as the gas source; (2) an a-Si:H<i> layer containing oxygen atoms, with a thickness of 2 nm as the second passivation sublayer was deposited by using $SiH_4$ with 10% carbon dioxide as the gas source; (3) an a-Si:H<i> layer containing oxygen atoms, with a thickness of 5 nm as the third passivation sublayer was deposited by using a mixture of $SiH_4$ and hydrogen gas with 40% carbon dioxide as the gas source, thereby completing the preparation of the first passivation layer.

An a-Si:H<n> layer with a thickness of 10 nm as the back surface field layer was deposited by PECVD on the first passivation layer.

An a-Si:H<i> layer with a thickness of 10 nm as the second passivation layer was deposited by PECVD on the second surface of the silicon substrate.

An a-Si:H<p> layer with a thickness of 12 nm as the emission electrode layer was deposited by PECVD on the second passivation layer.

A 10 wt. % tin-doped indium oxide-based TCO film with a thickness of 80 nm and a 3 wt. % tin-doped indium oxide-based TCO film with a thickness of 80 nm were respectively deposited on the back surface field layer and the emission electrode layer, forming the two transparent conducting films on both sides of the silicon substrate.

Metal silver grid lines with a thickness of 20 μm as the electrodes were screen-printed on the two transparent conducting films.

Example 2

An n-type monocrystalline silicon wafer was adopted as the silicon substrate. The n-type monocrystalline silicon wafer was cleaned and textured with lye to form pyramid-shaped light-trapping structures.

The first passivation layer was deposited on the first surface of the silicon substrate by PECVD. The specific process was as follows: (1) an a-Si:H<i> layer with a thickness of 1 nm as the first passivation sublayer was deposited by using $SiH_4$ as the gas source; (2) an a-Si:H<i> layer containing oxygen atoms, with a thickness of 1 nm was deposited by using $SiH_4$ with 10% carbon dioxide as the gas source, and an a-Si:H<i> layer containing oxygen atoms, with a thickness of 2 nm was deposited by using a mixture of $SiH_4$ and hydrogen gas with 20% carbon dioxide as the gas source, together as the second passivation sublayer:(3) an a-Si:H<i> layer containing oxygen atoms, with a thickness of 4 nm as the third passivation sublayer was deposited by using a mixture of $SiH_4$ and hydrogen gas with 40% carbon dioxide as the gas source; (4) an a-Si:H<i> layer containing oxygen atoms, with a thickness of 2 nm as the fourth passivation sublayer was deposited by using a mixture of $SiH_4$ and hydrogen gas with 50% carbon dioxide as the gas source, thereby completing the preparation of the first passivation layer.

An uc—$SiO_x$:H<n> layer with a thickness of 25 nm as the back surface field layer was deposited by PECVD on the first passivation layer.

An a-Si:H<i> layer with a thickness of 10 nm as the second passivation layer was deposited by PECVD on the second surface of the silicon substrate.

An a-Si:H<p> layer with a thickness of 12 nm as the emission electrode layer was deposited by PECVD on the second passivation layer.

A 10 wt. % tin-doped indium oxide-based TCO film with a thickness of 80 nm and a 3 wt. % tin-doped indium oxide-based TCO film with a thickness of 80 nm were respectively deposited on the back surface field layer and the emission electrode layer, forming the two transparent conducting films on both sides of the silicon substrate.

Metal silver grid lines with a thickness of 20 μm as the electrodes were screen-printed on the two transparent conducting films.

Comparative Example 1

An n-type monocrystalline silicon wafer was adopted as the silicon substrate. The n-type monocrystalline silicon wafer was cleaned and textured with lye to form pyramid-shaped light-trapping structures.

The first passivation layer was deposited on the first surface of the silicon substrate by PECVD. The specific process was as follows: an a-Si:H<i> layer with a thickness of 9 nm as the first passivation layer was deposited by using $SiH_4$ and a mixture of $SiH_4$ and hydrogen gas respectively as the gas source.

An a-Si:H<p> layer with a thickness of 10 nm as the back surface field layer was deposited by PECVD on the first passivation layer.

An a-Si:H<i> layer with a thickness of 10 nm as the second passivation layer was deposited by PECVD on the second surface of the silicon substrate.

An a-Si:H<p> layer with a thickness of 12 nm as the emission electrode layer was deposited by PECVD on the second passivation layer.

A 10 wt. % tin-doped indium oxide-based TCO film with a thickness of 80 nm and a 3 wt. % tin-doped indium oxide-based TCO film with a thickness of 80 nm were respectively deposited on the back surface field layer and the emission electrode layer, forming the two transparent conducting films on both sides of the silicon substrate.

Metal silver grid lines with a thickness of 20 μm as electrodes were screen-printed on the two transparent conducting films.

A plurality of cells of Example 1 or Comparative Example 1 were further assembled to form a solar cell module. The efficiency of the cells of Example 1 or Comparative Example 1 and the efficiency of the corresponding module were tested, and the CTM value was calculated. The CTM value was obtained by the module test efficiency/the cell test efficiency. Through calculation, the CTM value of the solar cell module prepared from the cells of Example 1 was 99.60%, while the CTM value of the solar cell module prepared from the cells of Comparative Example 1 was 99.24%. The CTM value of the solar cell module can be increased by gradually increasing the carbon dioxide concentration in preparation of the first passivation layer.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims, the description and drawings may be used to illustrate the content of the claim.

What is claimed is:

1. A method for preparing a heterojunction solar cell, comprising following steps:
depositing a first passivation layer on a first surface of a silicon substrate by using a gas source, a base material of the first passivation layer being hydrogenated amorphous silicon; during depositing hydrogenated amorphous silicon of the first passivation layer, allowing the gas source to gradually incorporate carbon dioxide, and controlling a proportion of carbon dioxide in the gas source to gradually increase with increase of a thickness of the first passivation layer which has been deposited;
depositing a back surface field layer on the first passivation layer, both the silicon substrate and the back surface field layer being in a first doping type;
depositing a second passivation layer on a second surface of the silicon substrate opposite to the first surface, the second passivation layer being made of hydrogenated amorphous silicon; and
depositing an emitter layer on the second passivation layer, the emitter layer being in a second doping type which is different from the first doping type;
wherein the depositing of the first passivation layer comprises following steps:
depositing a first passivation sublayer with a thickness of 1 nm to 2 nm on the silicon substrate by using the gas source in which the proportion of carbon dioxide is 0%;
depositing a second passivation sublayer with a thickness of 2 nm to 4 nm on the first passivation sublayer by using the gas source in which the proportion of carbon dioxide is 10% to 20%;
depositing a third passivation sublayer with a thickness of 3 nm to 6 nm on the second passivation sublayer by using the gas source in which the proportion of carbon dioxide is 30% to 40%; and
wherein the thickness of the third passivation sublayer is greater than the thickness of the second passivation sublayer, and a thickness difference between the second passivation sublayer and the third passivation sublayer is 3 nm.

2. The method of claim 1, wherein during the depositing of the first passivation layer, the proportion of carbon dioxide in the gas source gradually increases from 0.

3. The method of claim 2, wherein during the depositing of the first passivation layer, a thickness of a deposited portion of the first passivation layer is controlled to be smaller than 2 nm when the proportion of carbon dioxide in the gas source is 0.

4. The method of claim 1, wherein during the depositing of the first passivation layer, a maximum proportion of carbon dioxide in the gas source is 60%.

5. The method of claim 1, wherein during the depositing of the first passivation layer, the proportion of carbon dioxide in the gas source increases step by step.

6. The method of claim 5, wherein the proportion of carbon dioxide increases by 30% or less in adjacent steps.

7. The method of claim 1, wherein the thickness of the first passivation layer is controlled to be 7 nm to 12 nm.

8. The method of claim 1, wherein the depositing of the first passivation layer further comprises: depositing a fourth passivation sublayer with a thickness of 1 nm to 3 nm on the third passivation sublayer by using the gas source in which the proportion of carbon dioxide is 50% to 60%.

9. The method of claim 1, wherein during the depositing of the first passivation layer, a temperature of the silicon substrate is controlled to be 150° C. to 250° C.

10. The method of claim 1, wherein a gas pressure in a deposition chamber is controlled to be 10 Pa to 100 Pa.

* * * * *